(12) United States Patent
Fang et al.

(10) Patent No.: US 8,781,283 B1
(45) Date of Patent: Jul. 15, 2014

(54) HYBRID RIDGE WAVEGUIDE

(71) Applicants: Alexander W. Fang, Fremont, CA (US); Gregory A. Fish, Santa Barbara, CA (US); Steven C. Nicholes, Gilbert, AZ (US)

(72) Inventors: Alexander W. Fang, Fremont, CA (US); Gregory A. Fish, Santa Barbara, CA (US); Steven C. Nicholes, Gilbert, AZ (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 13/745,320

(22) Filed: Jan. 18, 2013

Related U.S. Application Data (63) Continuation of application No. 13/450,328, filed on Apr. 18, 2012, now Pat. No. 8,380,033, which is a continuation of application No. 12/943,743, filed on Nov. 10, 2010, now abandoned.

(51) Int. Cl.
*G02B 6/10* (2006.01)

(52) U.S. Cl.
USPC .............................. 385/131; 385/14; 385/132

(58) Field of Classification Search
USPC ........................................... 385/14, 129–132
See application file for complete search history.

(56) References Cited

U.S. PATENT DOCUMENTS

| | | | |
|---|---|---|---|
| 4,999,686 A | 3/1991 | Autier et al. | |
| 5,138,626 A | 8/1992 | Yap | |
| 5,745,630 A | 4/1998 | Vawter et al. | |
| 6,229,947 B1 | 5/2001 | Vawter et al. | |
| 6,374,001 B1 | 4/2002 | Bozeat et al. | |
| 6,768,855 B1 | 7/2004 | Bakke et al. | |
| 6,845,198 B2 | 1/2005 | Montgomery et al. | |
| 6,990,257 B2 | 1/2006 | Gunn, III et al. | |
| 7,184,613 B2 | 2/2007 | Samara-Rubio et al. | |
| 7,280,712 B2 | 10/2007 | Liu | |
| 7,408,693 B2 | 8/2008 | Kissa et al. | |
| 7,693,361 B2 | 4/2010 | Leem et al. | |
| 7,796,656 B2 | 9/2010 | Watson et al. | |
| 8,380,033 B1 * | 2/2013 | Fang et al. ................ | 385/131 |
| 2007/0170417 A1 | 7/2007 | Bowers | |
| 2008/0002929 A1 | 1/2008 | Bowers et al. | |
| 2009/0254298 A1 | 10/2009 | Harke | |
| 2010/0020837 A1 | 1/2010 | Gan | |
| 2013/0071058 A1 * | 3/2013 | Lim et al. ................ | 385/2 |

OTHER PUBLICATIONS

"Notice of Allowance for U.S. Appl. No. 13/450,328", (Oct. 31, 2012), Whole Document.
"Office Action for U.S. Appl. No. 13/450,328", (Jul. 2, 2012), Whole Document.
Fang, et al., "Electrically pumped hybrid AlGaInAs-silicon evanescent laser, Optical 2006 Society of America, Oct. 2, 2006 / vol. 14, No. 20 / Optics Express,", (Oct. 2006), 9203-9210.

* cited by examiner

*Primary Examiner* — Daniel Petkovsek
(74) *Attorney, Agent, or Firm* — Blakely Sokoloff Taylor & Zafman LLP (57) ABSTRACT

Embodiments of the invention relate to an electro-optic device comprising a first region of silicon semiconductor material and a second region of III-V semiconductor material. A waveguide of the optical device is formed in part by a ridge in the second region. An optical mode of the waveguide is laterally confined by the ridge of the second region and vertically confined by a vertical boundary included in the first region. The ridge structure further serves as a current confinement structure over the active region of the electro-optic device, eliminating the need for implantation or other structures that are known to present reliability problems during manufacturing. The lack of "voids" and implants in electro-optic devices according to embodiments of the invention leads to better device reliability, process repeatability and improved mechanical strength.

18 Claims, 6 Drawing Sheets

HYBRID RIDGE WAVEGUIDE

This application is a continuation of, and claims priority from, U.S. patent application Ser. No. 13/450,328, filed Jul. 2, 2012, which issued on Feb. 19, 2013 as U.S. Pat. No. 8,380,033, which claims priority from U.S. patent application Ser. No. 12/943,743 filed Nov. 10, 2010, which is incorporated by reference as if fully set forth herein.

FIELD

Embodiments of the invention generally pertain to photonic circuits, and more particularly to optical waveguides for hybrid photonic devices comprising silicon and III-V semiconductor material.

BACKGROUND

Figure 1:
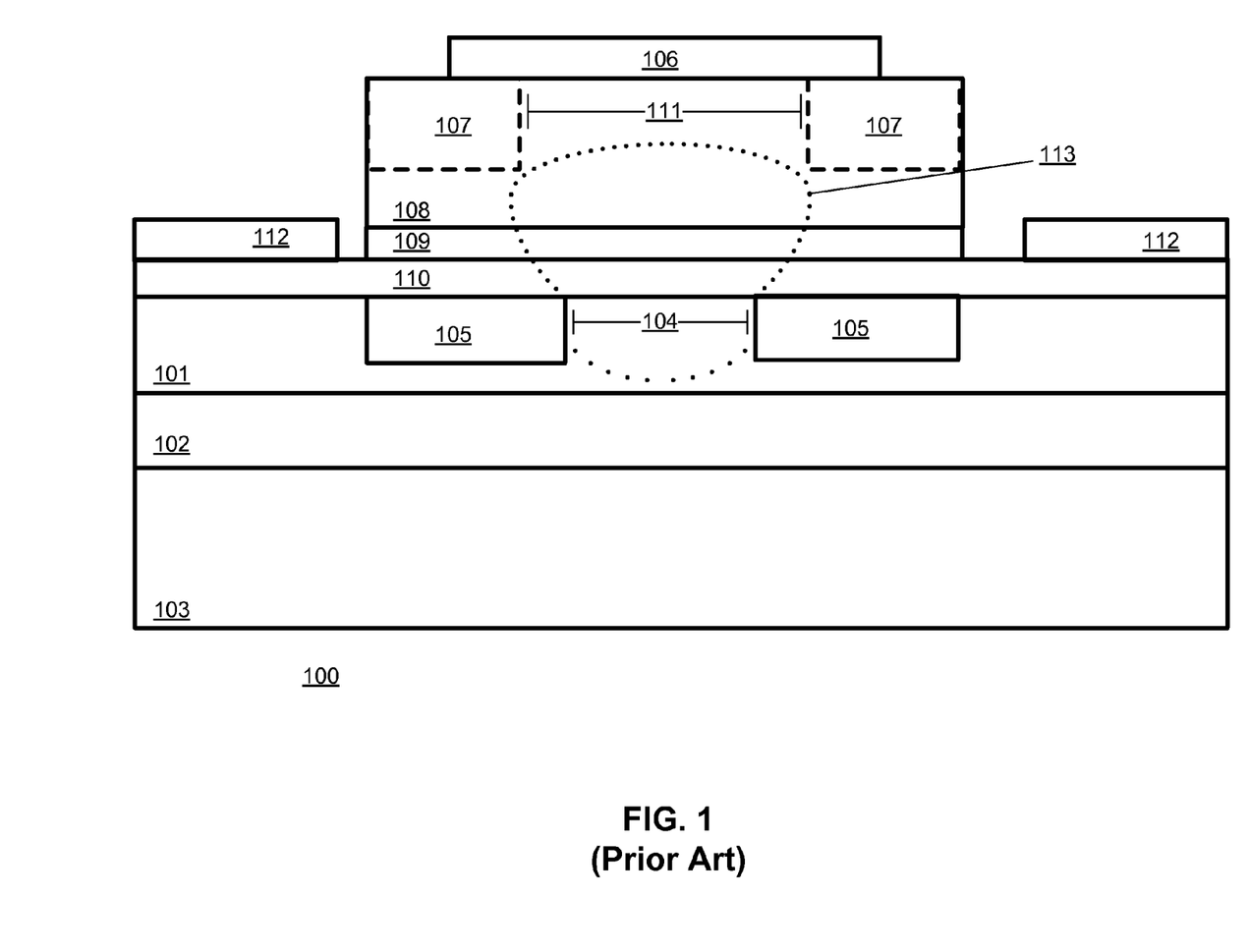
FIG. 1 is a block diagram of a prior art semiconductor laser.

Semiconductor photonic devices, such as lasers, have an active structure in which electrons and holes are converted into photons to produce optical emissions. FIG. 1 illustrates a cross-sectional view of prior art semiconductor laser 100. When a positive electrode is connected to p-type electrical contact 106 and negative electrodes are connected to n-type electrical contacts 112, and a voltage is applied, laser 100 becomes forward biased. Electrical current (i.e., holes and electrons) is injected towards active layer 109. Holes in p-type region 108 move in a direction away from p-type electrical contact 106 toward n-type electrical contacts 112. Electrons in n-type layer 110 move in a direction away from n-type contacts 112 toward p-type electrical contact 106. The active structure of laser 100 includes optical mode 113 and the portion of active layer 109 included in optical mode 113. As the holes and electrons meet at the active structure, the holes and electrons combine to emit light.

Regions 107 are implanted in order to inhibit electrical conduction and force the electrical current to flow from p-type electrical contact 106 through region 111 and into the portion of active layer 109 that overlaps optical mode 113. Implant regions 107 present reliability issues for device 100, as proton implanted regions cannot be too close to the active region of the device due to concerns about implant damage causing current to spread and leak outside of the confined area The prior art laser of FIG. 1 further includes silicon waveguide 104 formed on a silicon on insulator substrate that includes silicon top layer 101, silicon dioxide layer 102 and silicon substrate 103. Silicon waveguide 104 is formed by etched regions 105 included in silicon top layer 101.

Etched regions 105 cause several detrimental effects for laser 100. Creating said regions results in voids in the structure that reduce the mechanical strength of the device. These waveguide confinement structures further result in the device having poor thermal performance due to material loss where the material was etched away to form regions 105. The areas that heat may dissipate away from the laser's active region are also restricted due to regions 105 and layer 102. Prior art solutions to improve thermal performance have included creating thermal shunts in a lasing device, but this solution requires additional processing steps.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the present invention relate to an electro-optic device comprising a first region of silicon semiconductor material and a second region of III-V semiconductor material, wherein a waveguide of the device is formed in part by a ridge in the second region. An optical mode of the waveguide is laterally confined by the ridge of the second region and vertically confined by a vertical boundary included in the first region.

It will be understood in view of the example embodiments below that including a ridge to function as a lateral waveguide confinement in the III-V region of an electro-optic device, rather than creating voids in the silicon region of the device, allows for greater contact area between the III-V and silicon regions, thereby leading to better thermal conductivity and heat extraction out of the device. The ridge structure further serves as a current confinement structure over the active region of the electro-optic device, eliminating the need for implantation or other structures that are known to present reliability problems during manufacturing. The lack of "voids" and implants in electro-optic devices according to embodiments of the invention leads to better device reliability, process repeatability and improved mechanical strength.

Figure 2:
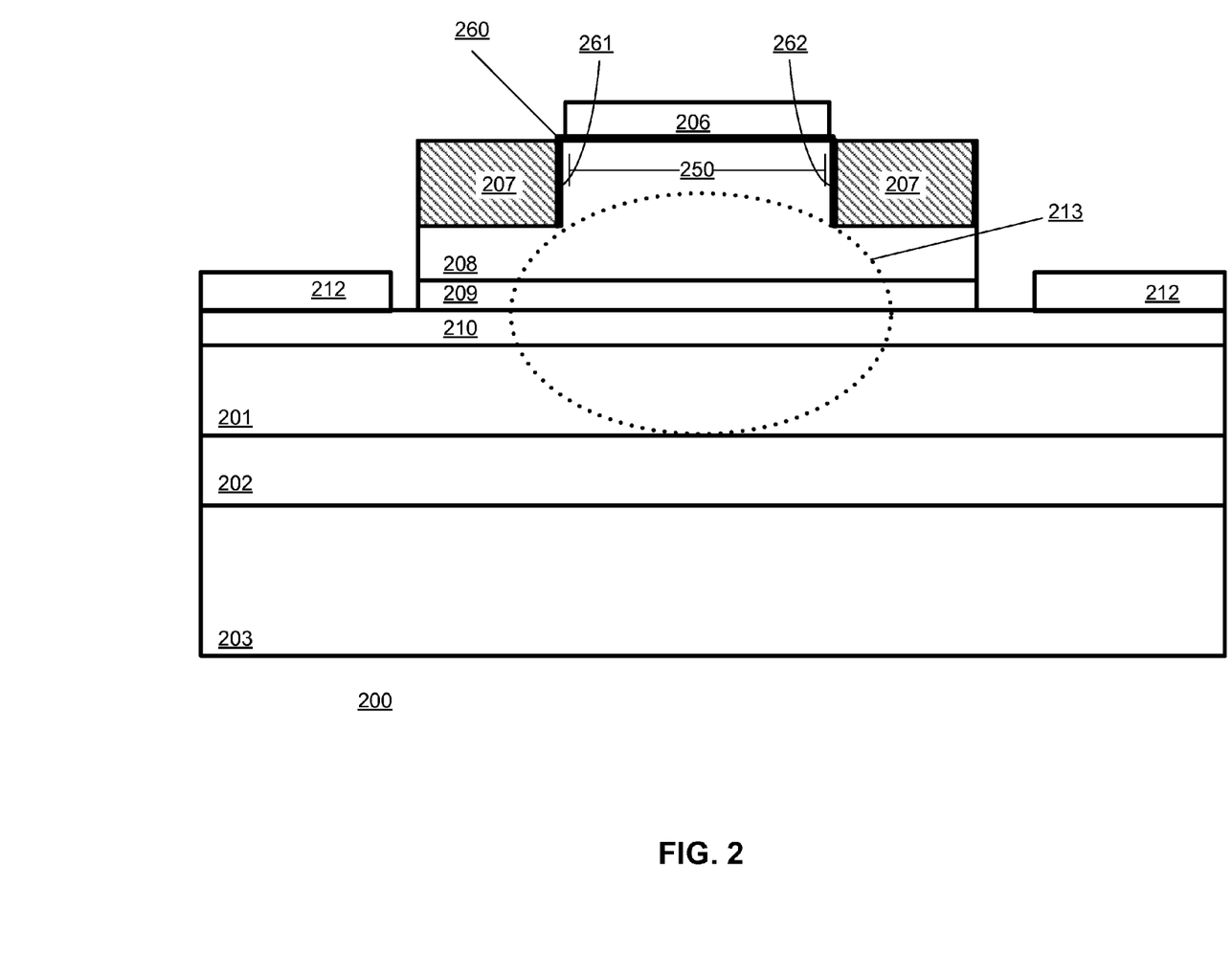
FIG. 2 is a block diagram of an optical device according to an embodiment of the invention.

In this embodiment, electro-optic device 200 includes a silicon semiconductor slab including silicon top layer 201, vertical confinement layer 202 and silicon substrate 203. It is to be understood that in alternative embodiments, substrate layer 203 may be a diamond substrate, a glass substrate, or any functional equivalent. Vertical confinement layer 202 may be formed of any dielectric material suitable for confining an optical mode (e.g., layer 201 may include a silicon dioxide layer, a silicon nitride layer, or any functionally equivalent insulating layer with a refractive index lower than silicon top layer 201).

In this embodiment, electro-optic device 200 includes a silicon semiconductor slab including silicon top layer 201, vertical confinement layer 202 and silicon substrate 203. It is to be understood that in alternative embodiments, substrate layer 203 may be a diamond substrate, a glass substrate, or any functional equivalent. Vertical confinement layer 202 may be formed of any dielectric material suitable for confining an optical mode (e.g., layer 201 may be a silicon dioxide layer, a silicon nitride layer, or any functionally equivalent insulating layer with a refractive index lower than silicon top layer 201).

Device 200 further includes a III-V semiconductor slab including p-type layer 208, active layer 209 and n-type layer 210 (thereby forming a P-I-N diode). The term "p-type layer," as used herein, describes a layer comprising a material that has more positive carriers (i.e., holes) than negative carriers (i.e., electrons). The term "n-type layer," as used herein, describes a layer comprising a material that has more negative carriers than positive carriers.

In an alternative embodiment, layer 208 may be an n-type layer, and layer 210 may be a p-type layer. In another alternative embodiment, layers 208 and 210 may be n-type layers, while active region 209 may include a tunnel junction to convert n-type majority carriers to p-type majority carriers. This alternative embodiment avoids the associated optical and microwave loss of p-type materials due to the use of p-dopants.

III-V semiconductor materials have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials for bandgaps closer to the wavelength of the light being transmitted or modulated, as electron speed in III-V semiconductors is much faster than that in silicon. In addition, III-V materials have a direct bandgap which is required for the most efficient creation of light from electrical pumping. Thus, III-V semiconductor materials enable photonic operations with an increased efficiency over silicon for both generating light and modulating the refractive index of light.

Active layer 209 is of a III-V semiconductor with high electro-optic efficiency—i.e., the absorption coefficient (i.e., the imaginary portion of the complex refractive index) and the refractive index (i.e., the real portion of the complex refractive index) of active layer 209 is easily affected by either the Franz Kheldysh effect if active layer 209 comprises bulk material (e.g., intrinsic Indium Gallium Arsenide Phosphide (i-InGaAsP) or Indium Aluminum Gallium Arsenide (InAlGaAs)) or the Quantum Confined Stark Effect (QCSE) if active layer 209 comprises multiple quantum wells (MQW).

Optical waveguide 250 is formed by ridge 260 (which is "bolded" or "thicker" in the figure for illustrative purposes only), including ridge sides 261 and 262. It is clear that in this embodiment, waveguide 250 is formed by features in the III-V region of device 200 as opposed to being formed by features in the silicon region of the device, as can be seen in FIG. 1, wherein waveguide 104 is formed by voids 105 included in silicon top region 101. Thus, the silicon and III-V regions of device 200 have a greater contact area than devices in the prior art (e.g., in this embodiment, layer 210 is continuously coupled to layer 201).

Overclad regions 207 may be formed on the device to improve mechanical stability, and may be of any material used to form vertical confinement layer 202 or any material with a lower refractive index than layer 208. Overclad regions 207 further provide vertical optical confinement and passivation as described below. It is understood that the areas adjacent to ridge sides 261 and 262 provide optical confinement if left as voids (i.e., areas comprising air), but that forming overclad regions 207 provides for mechanical stability in addition to optical confinement.

Thus, optical mode 213 is vertically confined by vertical confinement layer 202, ridge 260 and overclad regions 207 while being laterally confined by ridge sides 261 and 262. Said ridge sides also confine injection current from electrode 206 towards the portion of active layer 209 that overlaps optical mode 213. Embodiments of the invention thus eliminate the need for the etched regions (e.g., etched regions 105 of FIG. 1) and implanted regions (e.g., implant regions 107 of FIG. 1) of the prior art and reduce the associated reliability problems known in the art.

It will be understood that the optical device of FIG. 2 may be used to amplify, modulate or detect light transmitted through the optical waveguide of the device by applying an electrical difference to complimentary electrodes 206 and 212 to either forward bias (i.e., for amplification) or reverse bias (i.e., for modulation or detection) the structure. The complex refractive index (i.e., at least one of the real and the imaginary refractive index) of at least the portion of active layer 209 included in optical mode 213 changes based on an electrical difference (e.g., electrical voltage, electrical field) applied to electrodes 206 and 212. These changes to the refractive index (or indexes) are proportional to the strength of the electrical difference applied to electrodes 206 and 212.

In this embodiment, electrodes 212 are coupled to n-type layer 210. Thus, it is to be understood that there is no electrical conduction through silicon top layer 201. In this embodiment, as opposed to embodiments where electrical conduction does occur through the silicon top layer of a device (see below), resistance is high as it determined by thin layer 210; however, there are less processing steps needed to create device 200 and no conductive bond is required to couple the silicon region with the III-V region (i.e., no conductive bond is required to couple layers 210 and 201).

Figure 3:
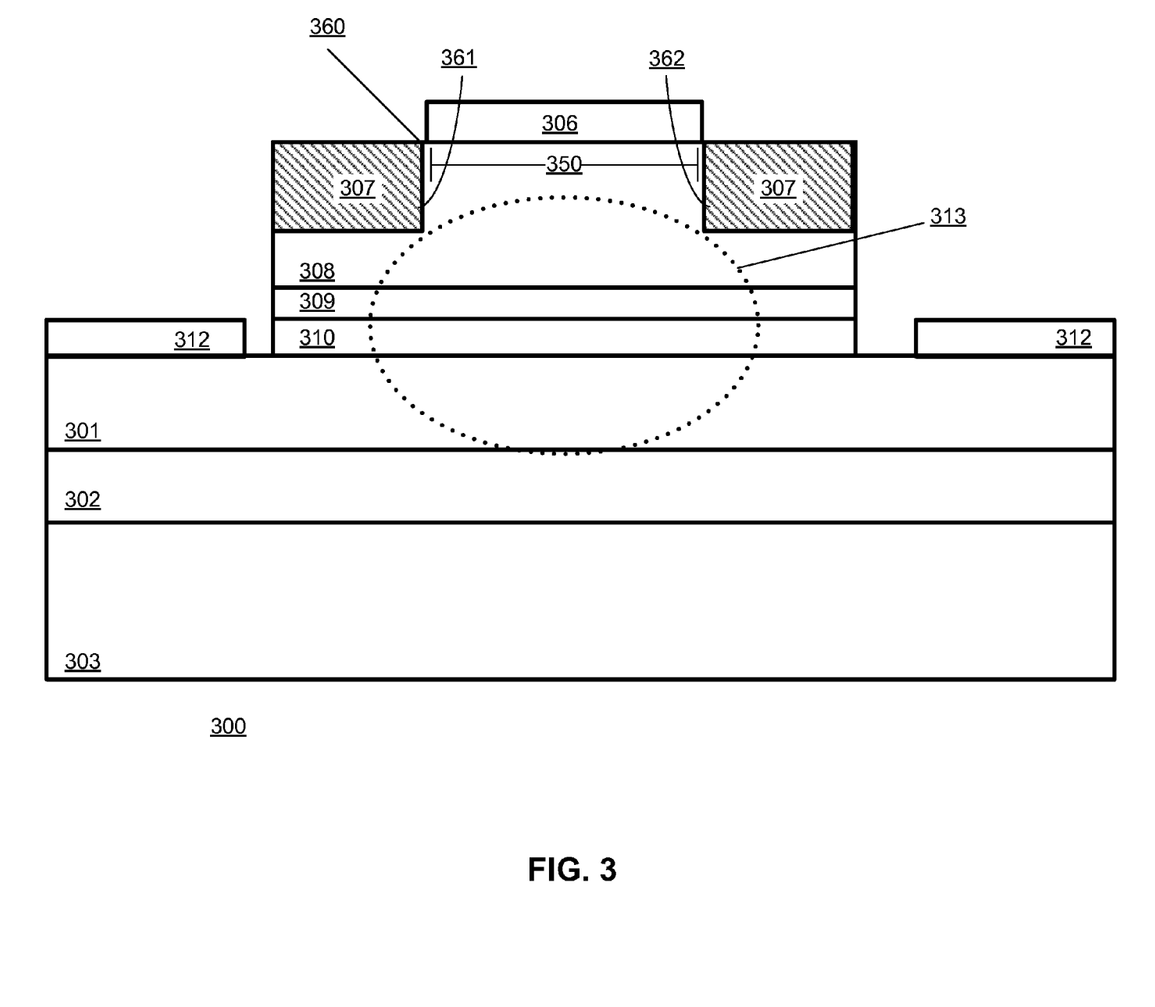
FIG. 3 is a block diagram of an optical device according to an embodiment of the invention.

FIG. 3 is a block diagram of an embodiment of the invention. In this embodiment, electro-optic device 300 includes a silicon semiconductor slab including silicon top layer 301, vertical confinement layer 302 and silicon substrate layer 303. It is to be understood that in alternative embodiments, silicon substrate layer 303 may be a diamond substrate, a glass substrate, or any functional equivalent. Device 300 further includes a III-V semiconductor slab including p-type layer 308, active layer 309 and n-type layer 310.

In an alternative embodiment, layer 308 may be an n-type layer, and layer 310 may be a p-type layer. In another alternative embodiment, layers 308 and 310 may be n-type layers, while active region 309 may include a tunnel junction to convert n-type majority carriers to p-type majority carriers.

Ridge 360 including sides 361 and 362 forms optical waveguide 350 and provides lateral confinement for optical mode 313 (vertical confinement layer 302, ridge 360 and overclad regions 307 provide vertical confinement of said optical mode). Overclad regions 307 may be formed on the device to improve mechanical stability, and may be of any material used to form vertical confinement layer 302.

In this example embodiment, electrodes 312 are coupled to silicon top layer 301 (as opposed to the example embodiment illustrated in FIG. 2, wherein electrodes 212 are coupled to III-V n-type layer 210). Thus, it is to be understood that electrical conduction occurs through both n-type layer 310 and silicon top layer 301 when an electrical difference is applied to electrodes 306 and 312. It is to be understood that this example arrangement allows for less resistance through layer 301 as it is thicker than n-type layer 210 of the embodiment illustrated in FIG. 2. It is to be further understood the silicon top layer 301 will suffer less optical loss if it is doped for conduction and if a conductive bond is used to couple layers 301 and 310.

Figure 4:
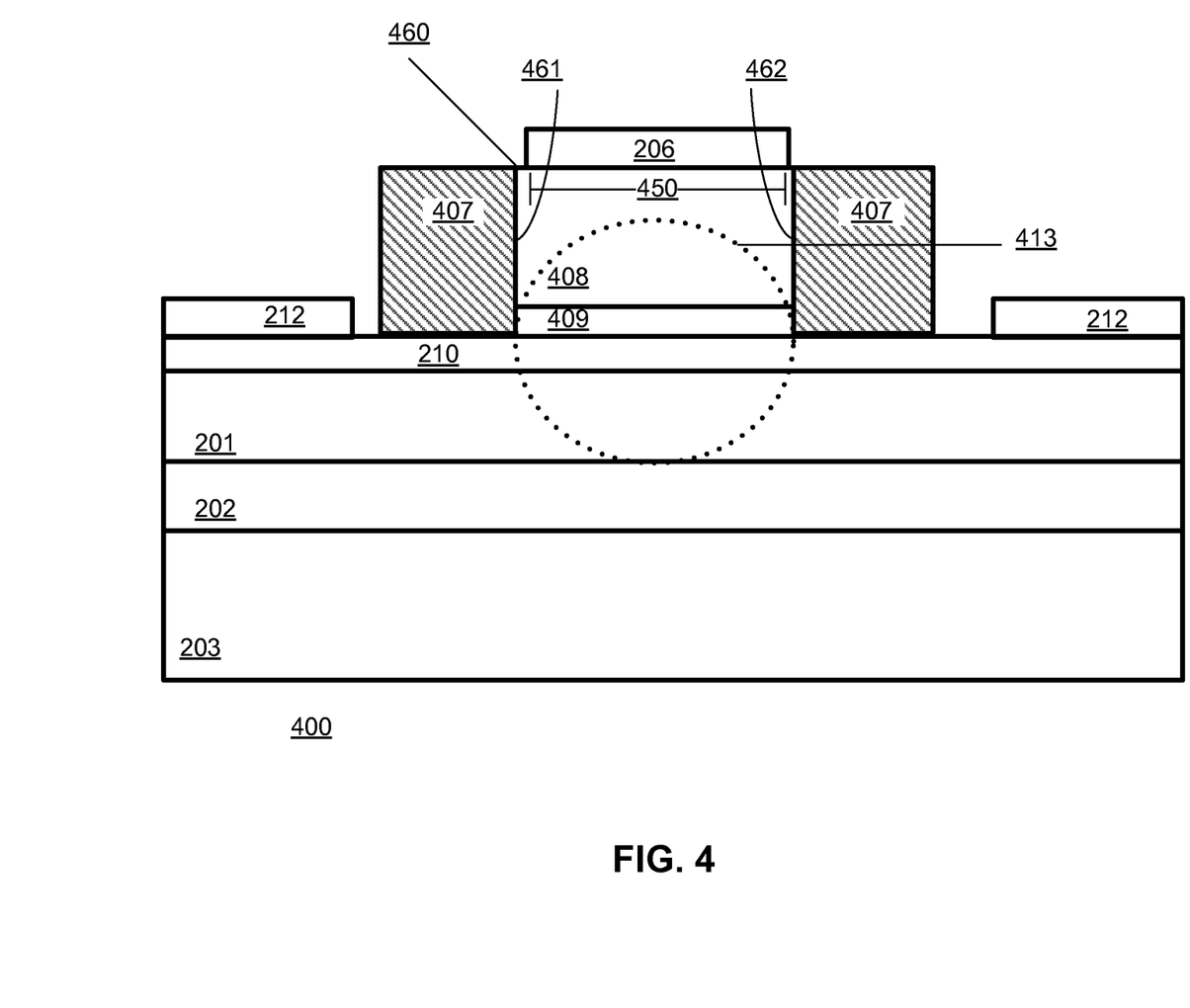
FIG. 4 is a block diagram of an optical device including an alternative waveguide confinement structure according to an embodiment of the invention.
Figure 5:
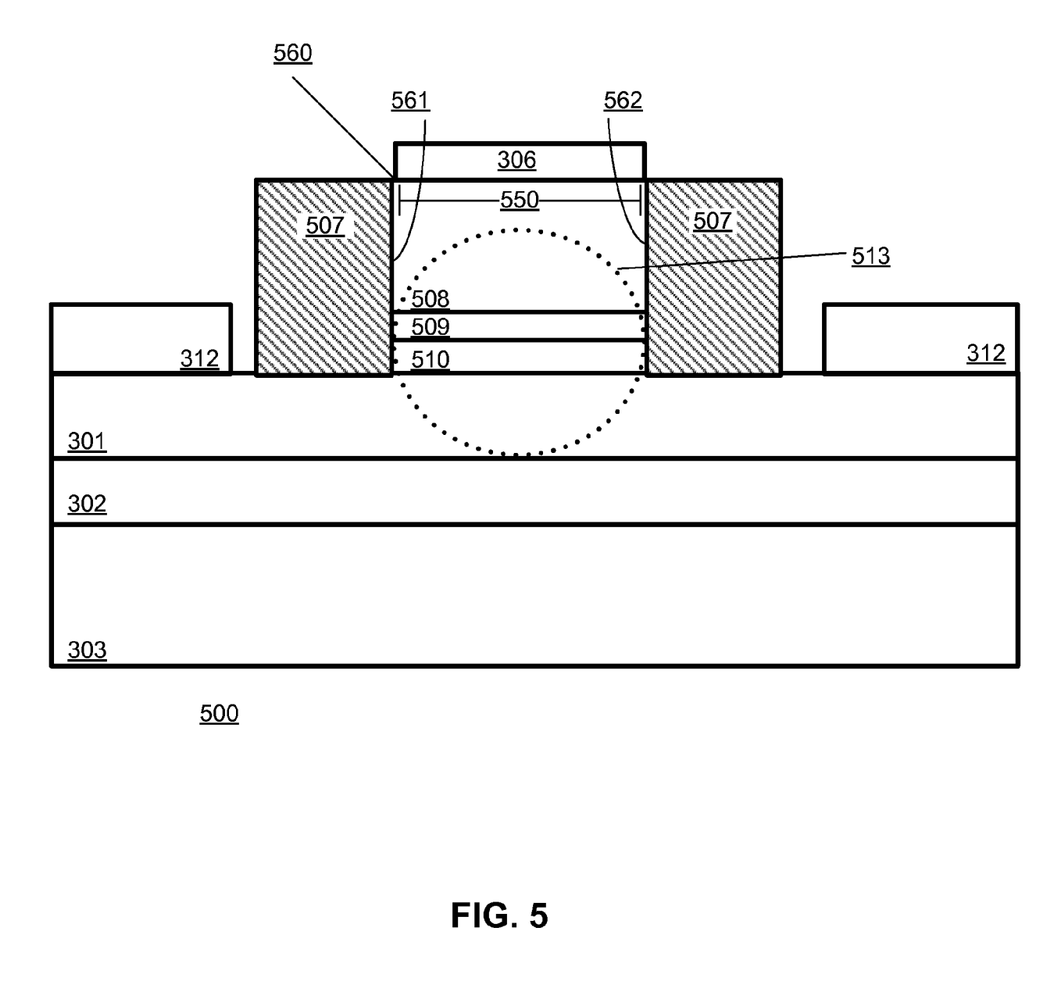
FIG. 5 is a block diagram of an optical device including an alternative waveguide confinement structure according to an embodiment of the invention.

The ridges illustrated in FIGS. 2 and 3 are shown to be included only in the top layers of the III-V semiconductor regions of their respective devices (i.e., ridges 260 and 360 are included only in p-type layers 208 and 308 respectively). It is to be understood that these ridges are to be viewed as examples only, and are not to limit the structure of ridges in alternative embodiments of the invention. FIGS. 4 and 5 illustrate alternative waveguide confinement structures according to embodiments of the invention. Device 400 of FIG. 4 is similar to device 200 of FIG. 2 as described above, except sides 461 and 462 of ridge 460 forming optical waveguide 450 extend through both p-type layer 408 and active layer 409 (as described above, in other embodiments the layer "above" active layer 409 may be an n-type layer). Thus optical mode 413 is laterally confined by ridge sides 461 and 462 and vertical confined by layer 202, and ridge sides 461 and 462 further confine the area in which active layer 409 receives current injected from electrode 206. Overclad regions 407 may further provide mechanical stability for device 400.

Device 500 of FIG. 5 is similar to device 300 of FIG. 3 as described above, except ridge sides 561 and 562 of ridge 560 forming optical waveguide 550 extend through the layers of the III-V region of the device—i.e., in this example p-type layer 508, active layer 509 and n-type layer 510 (the configuration of the layers of the III-V region of the device may differ in other embodiments as previously described). Thus optical mode 513 is laterally confined by ridge sides 561 and 562 and vertical confined by layer 202, and ridge sides 561 and 562 further confine the area in which the III-V semiconductor region of device 500 (i.e., the areas that n-type layer 510 and active layer 509 may receive current from electrodes 312 flowing through silicon top layer 301 is reduced). Overclad regions 507 may further provide mechanical stability for device 500.

Figure 6:
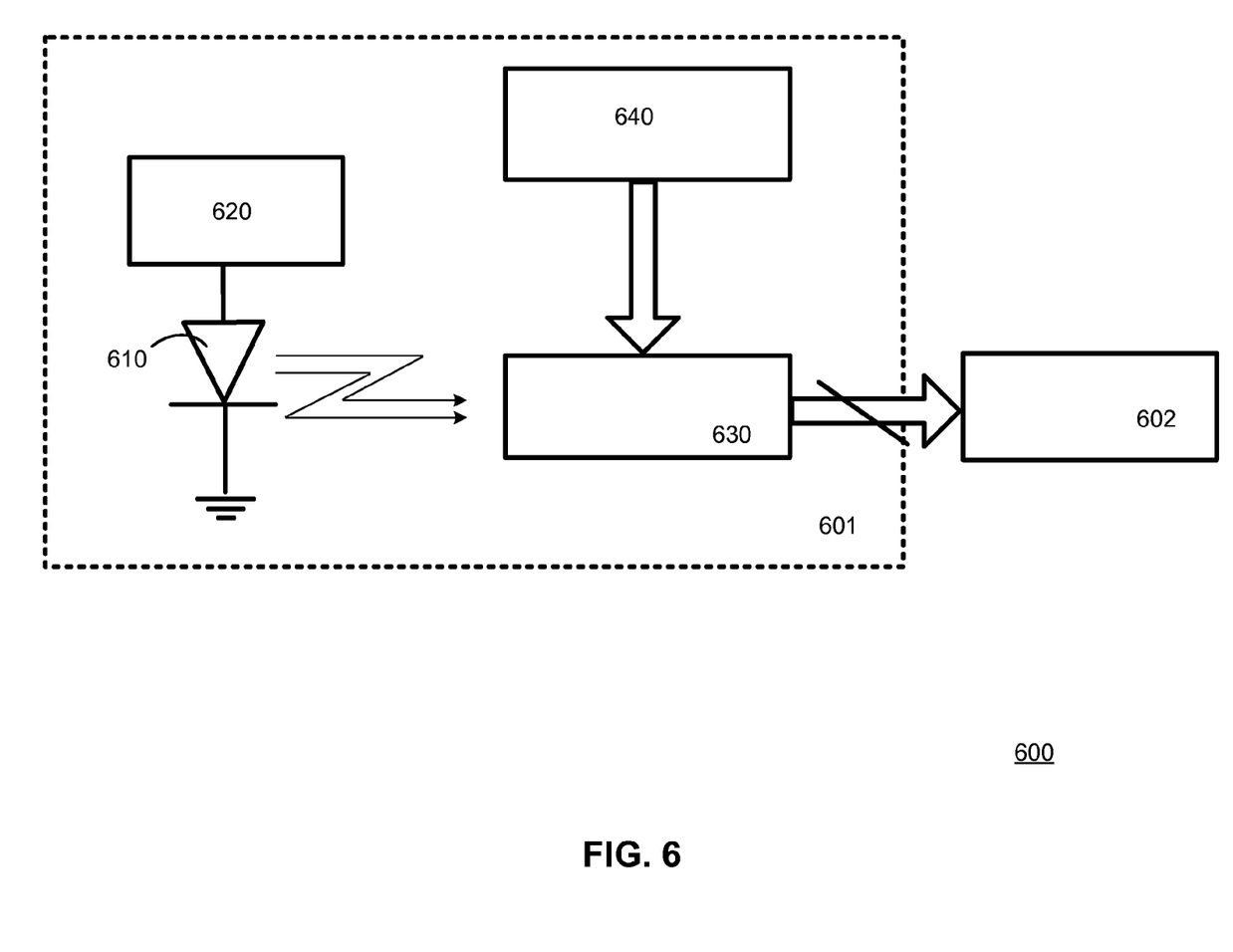
FIG. 6 is a block diagram of a simplified optical system utilizing embodiments of the invention.

FIG. 6 is a block diagram of a simplified optical system utilizing an embodiment of the invention. System 600 includes transmitter 601 and receiver 602. Transmitter 601 includes light source 610 and light source controller 620. In the illustrated embodiment, light source 620 is a laser utilizing a hybrid active gain structure, wherein the structure comprises any embodiment of the invention described above. Light source controller 620 may control the hybrid active gain structure of light source 610 (i.e., light source controller 620 may create an electrical difference at electrical contacts of light source 610). In one embodiment, light source controller 620 comprises silicon circuitry while light source 610 comprises III-V and silicon semiconductor material. Light source 610 may transmit optical signals to modulator 630 via any transmission medium known in the art.

The structure of modulator 630 may comprise any embodiment of the invention described above. Modulator 630 may perform either amplitude or phase modulation of the light received from light source 610. In one embodiment, optical waveguides of modulator 630 are controlled by modulator controller 640 (i.e., modulator controller 640 may create an electrical difference at electrical contacts of modulator 630). The modulated output of modulator 630 may be transmitted to receiver 602 via any transmission medium known in the art. Receiver 602 may include an optical device wherein the structure of said device comprises any embodiment of the invention described above.

In one embodiment, system 600 is included in a single device or chip, wherein silicon components of system 600 are included on a silicon portion of the chip, and III-V semiconductor components of system 600 are included on a III-V portion of the chip. These portions may be fabricated independently and subsequently bonded via any bonding process known in the art.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
    a first semiconductor slab comprising a silicon material and including a top silicon layer and a first vertical boundary, wherein the first vertical boundary comprises a material with a lower refractive index than silicon and is either:
        included in the top silicon layer; or
        formed as a layer separate from the top silicon layer;
    a second semiconductor slab above the first semiconductor slab comprising a III-V material and including:
        a top and a bottom charge carrier layer;
        an active layer disposed between the charge carrier layers;
        electrical contacts coupled to the first or the second semiconductor slab, the active layer to receive charge carriers from the charge carrier layers in response to an electrical difference applied to the electrical contacts; and
        a ridge included in at least the top charge carrier layer;
    at least one overclad region coupled to the ridge of the second semiconductor slab; and
    an optical waveguide included in the first and second semiconductor slab and formed, at least in part, by the ridge, wherein the ridge to laterally confine the optical mode of the optical waveguide, the first vertical boundary of the first semiconductor slab and the overclad region(s) to vertically confine an optical mode of the optical waveguide.

2. The apparatus of claim 1, wherein the first vertical boundary comprises an oxide layer.

3. The apparatus of claim 2, wherein the oxide layer comprises a plurality of oxide regions.

4. The apparatus of claim 1, wherein the electrical contacts comprise:
    an n-type electrical contact coupled to the second semiconductor slab; and a p-type electrical contact coupled to the second semiconductor slab; and wherein the top and bottom charge carrier layers of the second semiconductor slab comprise, respectively:
a p-type layer coupled to the p-type electrical contact; and
an n-type layer coupled to the first semiconductor slab and the n-type electrical contact.

5. The apparatus of claim 4, the ridge further included in the active layer and to extend to the n-type layer.

6. The apparatus of claim 1, wherein the electrical contacts comprise:
an n-type electrical contact coupled to the second semiconductor slab; and
a p-type electrical contact coupled to the second semiconductor slab; and wherein the top and bottom charge carrier layers of the second semiconductor slab comprise, respectively:
an n-type layer coupled to the n-type electrical contact; and
a p-type layer coupled to the first semiconductor slab and the p-type electrical contact.

7. The apparatus of claim 1, wherein the top and bottom charge carrier layers of the second semiconductor slab comprise, respectively:
a first n-type layer including the ridge; and
a second n-type layer coupled to the first semiconductor slab; and wherein the active layer includes a tunnel junction to convert n-type majority carriers of one of the n-type layers to p-type majority carriers.

8. The apparatus of claim 1, wherein the electrical contacts comprise:
an n-type electrical contact coupled to the first semiconductor slab; and
a p-type electrical contact coupled to the second semiconductor slab; and wherein the first and second semiconductor slabs are coupled via a conductive bonding layer, and the top and bottom charge carrier layers of the second semiconductor slab comprise, respectively:
a p-type layer coupled to the p-type electrical contact; and
an n-type layer coupled to the conductive bonding layer.

9. The apparatus of claim 8, the ridge further included in the active layer and the n-type layer and to extend to the conductive bonding layer.

10. A system comprising:
a light source;
a modulator to receive light from the light source; and
a transmission medium to operatively couple the light source and the modulator;
wherein at least one of the light source and the modulator comprises:
a first semiconductor slab comprising a silicon material and including a top silicon layer and a first vertical boundary, wherein the first vertical boundary comprises a material with a lower refractive index than silicon and is either:
included in the top silicon layer; or
formed as a layer separate from the top silicon layer;
a second semiconductor slab above the first semiconductor slab comprising a III-V material and including:
a top and a bottom charge carrier layer;
an active layer disposed between the charge carrier layers;
electrical contacts coupled to the first or the second semiconductor slab, the active layer to receive charge carriers from the charge carrier layers in response to an electrical difference applied to the electrical contacts; and
a ridge included in at least the top charge carrier layer;
at least one overclad region coupled to the ridge of the second semiconductor slab; and
an optical waveguide included in the first and second semiconductor slab and formed, at least in part, by the ridge, wherein the ridge to laterally confine the optical mode of the optical waveguide, the first vertical boundary of the first semiconductor slab and the overclad region(s) to vertically confine an optical mode of the optical waveguide.

11. The system of claim 10, wherein the first vertical boundary layer comprises an oxide layer.

12. The system of claim 11, wherein the oxide layer comprises a plurality of oxide regions.

13. The system of claim 10, wherein the electrical contacts comprise:
an n-type electrical contact coupled to the second semiconductor slab; and
a p-type electrical contact coupled to the second semiconductor slab; and wherein the top and bottom charge carrier layers of the second semiconductor slab comprise, respectively:
a p-type layer coupled to the p-type electrical contact; and
an n-type layer coupled to the first semiconductor slab and the n-type electrical contact.

14. The system of claim 10, wherein the electrical contacts comprise:
an n-type electrical contact coupled to the second semiconductor slab; and
a p-type electrical contact coupled to the second semiconductor slab; and wherein the top and bottom charge carrier layers of the second semiconductor slab comprise, respectively:
an n-type layer coupled to the n-type electrical contact; and
a p-type layer coupled to the first semiconductor slab and the p-type electrical contact.

15. The system of claim 14, the ridge further included in the active layer and to extend to the n-type layer.

16. The system of claim 10, wherein the top and bottom charge carrier layers of the second semiconductor slab comprise, respectively:
a first n-type layer including the ridge; and
a second n-type layer coupled to the first semiconductor slab; and wherein the active layer includes a tunnel junction to convert n-type majority carriers of one of the n-type layers to p-type majority carriers.

17. The system of claim 10, wherein the electrical contacts comprise:
an n-type electrical contact coupled to the first semiconductor slab; and
a p-type electrical contact coupled to the second semiconductor slab; and wherein the first and second semiconductor slabs are coupled via a conductive bonding layer, and the top and bottom charge carrier layers of the second semiconductor slab comprise, respectively:
a p-type layer coupled to the p-type electrical contact; and
an n-type layer coupled to the conductive bonding layer.

18. The system of claim 17, the ridge further included in the active layer and the n-type layer and to extend to the conductive bonding layer.

* * * * *